United States Patent
Chiu et al.

(10) Patent No.: US 12,500,131 B2
(45) Date of Patent: Dec. 16, 2025

(54) ELECTRONIC PACKAGE INCLUDING AN INTERPOSER STACKED ON AN ELECTRONIC ELEMENT AND MANUFACTURING METHOD THEREOF

(71) Applicant: SILICONWARE PRECISION INDUSTRIES CO., LTD., Taichung (TW)

(72) Inventors: Chih-Hsien Chiu, Taichung (TW); Wen-Jung Tsai, Taichung (TW); Ko-Wei Chang, Taichung (TW); Chien-Cheng Lin, Taichung (TW)

(73) Assignee: SILICONWARE PRECISION INDUSTRIES CO., LTD., Taichung (TW)

( * ) Notice: Subject to any disclaimer, the term of this patent is extended or adjusted under 35 U.S.C. 154(b) by 406 days.

(21) Appl. No.: 18/173,883

(22) Filed: Feb. 24, 2023

(65) Prior Publication Data

US 2024/0170355 A1    May 23, 2024

(30) Foreign Application Priority Data

Nov. 21, 2022  (TW) .................. 111144450

(51) Int. Cl.
*H01L 23/31*  (2006.01)
*H01L 23/00*  (2006.01)
(Continued)

(52) U.S. Cl.
CPC ...... *H01L 23/3114* (2013.01); *H01L 23/3128* (2013.01); *H01L 23/481* (2013.01); *H01L 23/49822* (2013.01); *H01L 23/5383* (2013.01); *H01L 24/16* (2013.01); *H01L 24/32* (2013.01); *H01L 24/48* (2013.01); *H01L 24/73* (2013.01); *H01L 24/81* (2013.01); *H01L 24/85* (2013.01); *H01L 25/105* (2013.01); *H01L 2224/16227* (2013.01); *H01L 2224/32145* (2013.01); *H01L 2224/48227* (2013.01);
(Continued)

(58) Field of Classification Search
CPC ............. H01L 23/481; H01L 23/49822; H01L 23/3114; H01L 23/538–5389; H01L 24/13; H01L 24/16; H01L 24/48; H01L 24/73; H01L 24/81; H01L 24/85; H01L 25/0657; H01L 25/5383; H01L 25/105; H01L 23/314; H01L 23/5383; H01L 2224/48227; H01L 2224/73265; H01L 2224/85; H01L 21/56
See application file for complete search history.

(56) References Cited

U.S. PATENT DOCUMENTS 9,508,703 B2 *  11/2016  Yu ....................... H01L 25/0657
11,037,879 B2 *  6/2021  Otsuka ................. H01L 23/5385
(Continued)

*Primary Examiner* — Khiem D Nguyen
(74) *Attorney, Agent, or Firm* — Studebaker Brackett PLLC

(57) ABSTRACT

An electronic package is provided, in which an electronic element is disposed on a carrier structure, and an interposer is stacked on the electronic element. Further, a wire is connected to the interposer and grounds the carrier structure, such that the wire and the interposer surround the electronic element. Therefore, the wire can be used as a shielding element when the electronic package is in operation to prevent the electronic element from being subjected to external electromagnetic interference.

16 Claims, 7 Drawing Sheets

(51) Int. Cl.
*H01L 23/48* (2006.01)
*H01L 23/498* (2006.01)
*H01L 23/538* (2006.01)
*H01L 25/10* (2006.01)

(52) U.S. Cl.
CPC ............ *H01L 2224/73253* (2013.01); *H01L 2224/73265* (2013.01); *H01L 2224/81801* (2013.01); *H01L 2224/85* (2013.01)

(56) References Cited

U.S. PATENT DOCUMENTS

| | | | |
|---|---|---|---|
| 2008/0087987 A1* | 4/2008 | Wang | B81B 7/0064 257/659 |
| 2012/0133041 A1* | 5/2012 | Phee | H01L 23/481 257/737 |
| 2013/0037935 A1* | 2/2013 | Xue | H01L 23/3114 257/737 |
| 2020/0075554 A1* | 3/2020 | Hsu | H01L 24/32 |
| 2020/0328187 A1* | 10/2020 | Cho | H01L 23/5385 |
| 2021/0229981 A1* | 7/2021 | Besling | G01D 11/245 |

\* cited by examiner

ELECTRONIC PACKAGE INCLUDING AN INTERPOSER STACKED ON AN ELECTRONIC ELEMENT AND MANUFACTURING METHOD THEREOF

BACKGROUND

1. Technical Field

The present disclosure relates to a semiconductor packaging technology, and more particularly, to an electronic package that can prevent electromagnetic interference and a manufacturing method thereof.

2. Description of Related Art

With the vigorous development of the electronic industry, electronic products are gradually moving towards multifunctional and high-performance trends. In order to meet the needs of miniaturization of electronic products and electronic packages installed therein, the technology of chip scale package (CSP) has been developed, which is characterized in that the package structure of this kind of chip scale package has only a size equal to or slightly larger than the size of the chip.

FIG. 1A to FIG. 1E are schematic cross-sectional views illustrating a method of manufacturing a semiconductor package 1 of the conventional chip scale package.

As shown in FIG. 1A, a thermal release tape 100 (e.g., a thermal release layer) is formed on a carrier 10.

Next, a plurality of semiconductor elements 11 are disposed on the thermal release tape 100, wherein each of the semiconductor elements 11 has an active surface 11a and an inactive surface 11b opposing the active surface 11a, and a plurality of electrode pads 110 are formed on each of the active surfaces 11a, and each of the active surfaces 11a is adhered onto the thermal release tape 100.

As shown in FIG. 1B, an encapsulant 14 is formed on the thermal release tape 100 to cover the plurality of semiconductor elements 11.

As shown in FIG. 1C, the encapsulant 14 is baked to harden the thermal release tape 100, and the thermal release tape 100 and the carrier 10 are removed to expose the active surfaces 11a of the semiconductor elements 11.

As shown in FIG. 1D, a circuit structure 16 is formed on the encapsulant 14 and the active surfaces 11a of the semiconductor elements 11, so that the circuit structure 16 is electrically connected to the plurality of electrode pads 110. Next, an insulating protection layer 18 is formed on the circuit structure 16, and parts of the surface of the circuit structure 16 are exposed from the insulating protection layer 18 for bonding conductive elements 17 such as solder balls.

As shown in FIG. 1E, a singulation process is performed along cutting paths L shown in FIG. 1D to obtain a plurality of semiconductor packages 1.

However, when the conventional semiconductor package 1 is in operation, the semiconductor element 11 is very sensitive to external electromagnetic waves, so that the semiconductor element 11 is unable to operate normally and may be damaged due to external electromagnetic waves.

Therefore, how to overcome the above-mentioned various problems of the prior art has become an urgent problem to be solved at present.

SUMMARY

In view of the various deficiencies of the prior art, the present disclosure provides an electronic package, which comprises: a carrier structure having a routing layer; an electronic element disposed on the carrier structure and electrically connected to the routing layer; an interposer stacked on the electronic element and including a semiconductor substrate, wherein the semiconductor substrate has a first surface and a second surface opposing the first surface, and the semiconductor substrate is bonded onto the electronic element with the second surface, wherein the first surface of the semiconductor substrate is arranged with a plurality of first contacts and at least one second contact, and a plurality of conductors are formed on the plurality of first contacts; and at least one wire connected to the at least one second contact and the carrier structure and grounding the carrier structure.

The present disclosure also provides a method of manufacturing an electronic package, the method comprises: providing a carrier structure with a routing layer, an electronic element and an interposer including a semiconductor substrate, wherein the semiconductor substrate has a first surface and a second surface opposing the first surface, and a plurality of first contacts and at least one second contact are arranged on the first surface of the semiconductor substrate, and a plurality of conductors are formed on the plurality of first contacts; disposing the electronic element and the interposer on the carrier structure, the interposer being stacked on the electronic element, wherein the electronic element is electrically connected to the routing layer, and the semiconductor substrate is bonded onto the electronic element with the second surface; and connecting at least one wire to the at least one second contact and the carrier structure, wherein the at least one wire grounds the carrier structure.

In one embodiment, the interposer further includes a routing structure bonded onto the first surface of the semiconductor substrate, and the plurality of first contacts and the at least one second contact are disposed on the routing structure.

In one embodiment, the interposer further includes a metal layer bonded to the electronic element. For example, the metal layer is located on the second surface of the semiconductor substrate of the interposer.

In one embodiment, the semiconductor substrate has at least one conductive via connecting the first surface and the second surface, and the conductive via grounds the wire via the at least one second contact.

In one embodiment, the at least one second contact is a plurality of second contacts, and the at least one wire is a plurality of wires, wherein at least one of the plurality of wires is communicatively connected to at least one of the plurality of second contacts and the carrier structure, and at least another one of the plurality of wires is grounded and connected to at least another one of the plurality of second contacts and the carrier structure.

In one embodiment, the interposer has a width greater than a width of the electronic element.

In one embodiment, the method further comprises forming a cladding layer on the carrier structure, wherein the electronic element, the interposer and the wire are covered by the cladding layer. For example, end surfaces of the plurality of conductors are coplanar with an upper surface of the cladding layer. The method further comprises forming a circuit structure on the cladding layer, wherein the circuit structure is electrically connected to the plurality of conductors of the interposer.

As can be seen from the above, the electronic package of the present disclosure and the manufacturing method thereof are to surround the electronic element by connecting the interposer and grounding the carrier structure via the wire. Therefore, compared with the prior art, the wire can be used as a shielding element when the electronic package of the present disclosure is in operation so as to prevent the electronic element from being subjected to external electromagnetic interference, so that the electronic element can be performed normally and the damage of the electronic element can be avoided, such that the electronic package can effectively maintain the normal operation of the product to improve the reliability of the product.

DETAILED DESCRIPTIONS

The following describes the implementation of the present disclosure with examples. Those skilled in the art can easily understand other advantages and effects of the present disclosure from the contents disclosed in this specification.

It should be understood that, the structures, ratios, sizes, and the like in the accompanying figures are used for illustrative purposes to facilitate the perusal and comprehension of the contents disclosed in the present specification by one skilled in the art, rather than to limit the conditions for practicing the present disclosure. Any modification of the structures, alteration of the ratio relationships, or adjustment of the sizes without affecting the possible effects and achievable proposes should still be deemed as falling within the scope defined by the technical contents disclosed in the present specification. Meanwhile, terms such as "upper," "on," "first," "second," "a," "one" and the like used herein are merely used for clear explanation rather than limiting the practicable scope of the present disclosure, and thus, alterations or adjustments of the relative relationships thereof without essentially altering the technical contents should still be considered in the practicable scope of the present disclosure.

FIG. 2A to FIG. 2E are schematic cross-sectional views illustrating a method of manufacturing an electronic package 2 according to the present disclosure.

Figure 1A:
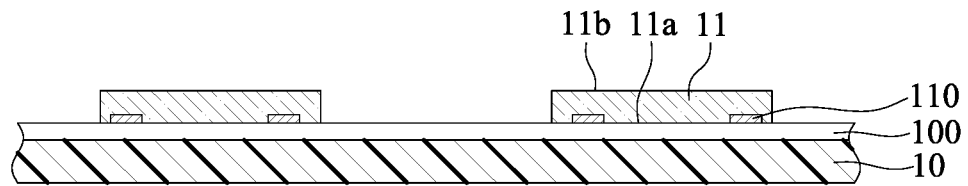
FIG. 1A to FIG. 1E are schematic cross-sectional views illustrating a method of manufacturing a conventional semiconductor package.
Figure 1B:
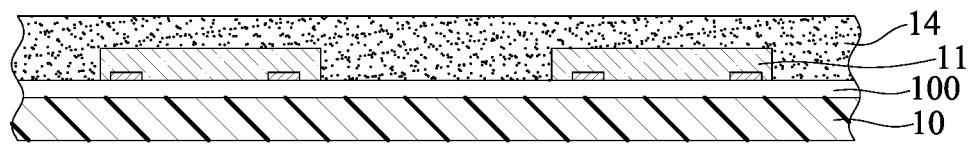
Figure 1C:
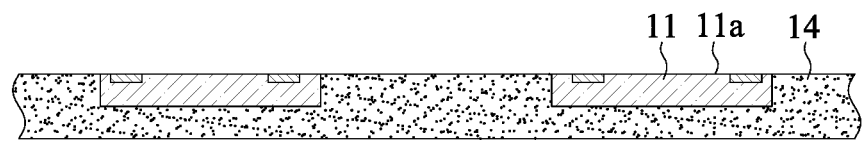
Figure 1D:
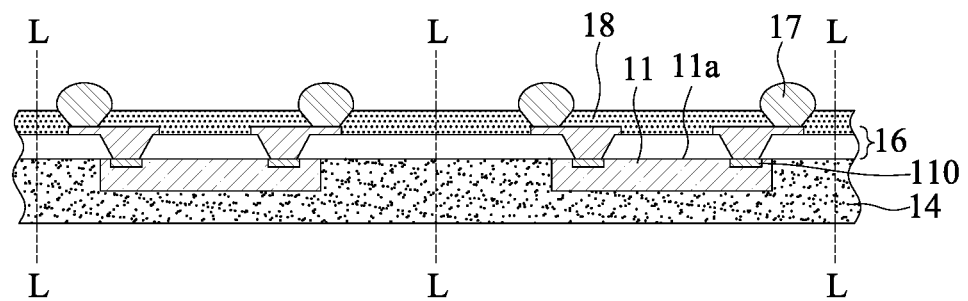
Figure 1E:
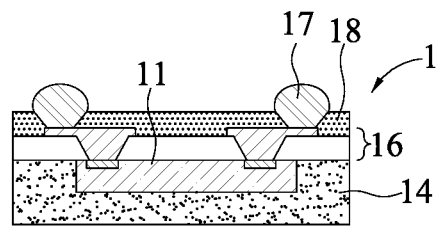
Figure 2A:
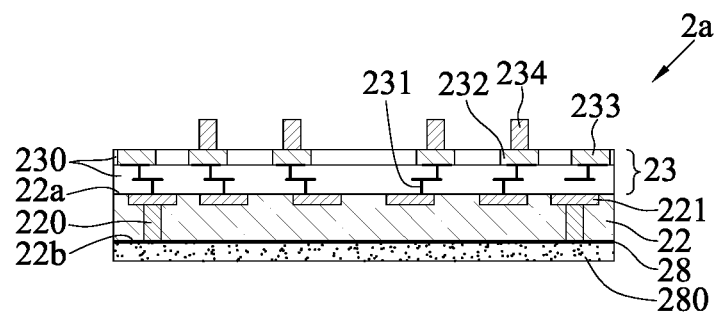
FIG. 2A to FIG. 2E are schematic cross-sectional views illustrating a method of manufacturing an electronic package according to the present disclosure.

As shown in FIG. 2A, an interposer 2a is provided and includes a semiconductor substrate 22, a metal layer 28 and a routing structure 23 (e.g., a wiring structure).

The semiconductor substrate 22 has a first surface 22a and a second surface 22b opposing the first surface 22a, and a plurality of electrode pads 221 are arranged on the first surface 22a.

In an embodiment, the semiconductor substrate 22 has at least one conductive via 220 connecting the first surface 22a and the second surface 22b, such as a conductive through-silicon via (TSV), so that some of the electrode pads 221 are electrically connected to the conductive vias 220.

The metal layer 28 is formed on the second surface 22b of the semiconductor substrate 22 to contact and electrically connect the conductive vias 220.

In an embodiment, the metal layer 28 is a copper layer, which can be formed on the second surface 22b of the semiconductor substrate 22 by methods such as sputtering, vaporing, electroplating, electroless plating, or chemical plating; alternatively, the metal layer 28 can be fixed on the second surface 22b of the semiconductor substrate 22 by means of a copper sheet or a foiling film.

The routing structure 23 is formed on the first surface 22a of the semiconductor substrate 22 to electrically connect the electrode pads 221.

In an embodiment, the routing structure 23 includes a plurality of insulating layers 230, and a plurality of redistribution layers (RDLs) 231 formed on the insulating layers 230 and electrically connected to the electrode pads 221. For example, the material for forming the redistribution layers 231 is copper, and the material for forming the insulating layers 230 is polybenzoxazole (PBO), polyimide (PI), prepreg (PP), or other dielectric materials.

Moreover, the routing structure 23 may have a plurality of first contacts 232 and at least one second contact 233 exposed from the insulating layer 230 on the outermost redistribution layer 231, so that bump-shaped conductors 234 such as copper pillars or solder balls are bonded onto the first contacts 232.

Figure 2B:
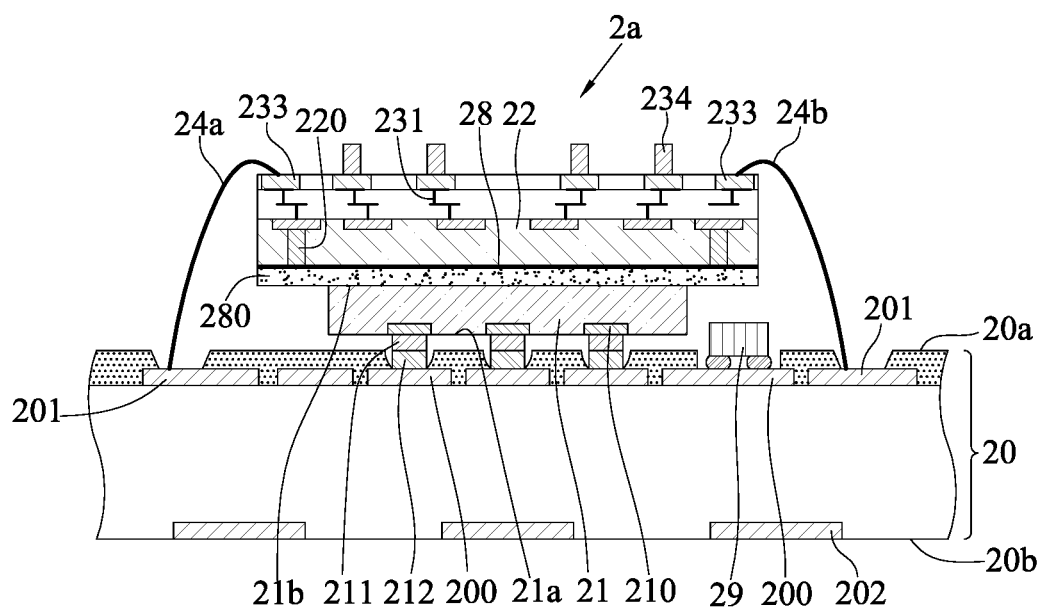

As shown in FIG. 2B, the interposer 2a, at least one electronic element 21 and at least one passive element 29 are arranged on a carrier structure 20, so that the electronic element 21 and the passive element 29 are electrically connected to the carrier structure 20, and the interposer 2a is stacked and bonded onto the electronic element 21 with the metal layer 28. Afterwards, the second contacts 233 are connected to the carrier structure 20 by wires 24a, 24b, so that the interposer 2a is electrically connected to the carrier structure 20.

The carrier structure 20 is in the form of a carrier board for packaging, such as a package substrate with a core layer and a circuit structure, a package substrate with a coreless circuit structure, a through-silicon interposer (TSI) with conductive through-silicon vias (TSVs), or other board types, wherein the carrier structure 20 includes at least one routing layer such as at least one fan-out redistribution layer (RDL). It should be understood that the carrier structure 20 can also be other chip-carrying boards, such as lead frames, wafers, or other boards with metal routings, and is not limited to the above.

In an embodiment, the carrier structure 20 is defined with a first side 20a and a second side 20b opposing the first side 20a, and the routing layer of the carrier structure 20 on the first side 20a of the carrier structure 20 has a plurality of electrical contact pads 200, 201, and the routing layer of the carrier structure 20 on the second side 20b of the carrier structure 20 has a plurality of ball-placement pads 202, wherein the material for forming the electrical contact pads 200, 201 and the ball-placement pads 202 is a metal material such as copper. It should be understood that the carrier structure 20 has a plurality of circuit layers inside (not shown) to electrically connect the electrical contact pads 200, 201 and the ball-placement pads 202.

The electronic element 21 is an active element, a passive element, or a combination of the active element and the passive element, wherein the active element is such as a semiconductor chip, and the passive element is such as a resistor, a capacitor, or an inductor.

In an embodiment, the electronic element 21 is a semiconductor chip, such as a microcontroller unit (MCU) or an application specific integrated circuit (ASIC), and the electronic element 21 has an active surface 21a and an inactive surface 21b opposing the active surface 21a. Further, a plurality of electrode pads 210 are formed on the active surface 21a, and the electronic element 21 is disposed on some of the electrical contact pads 200 via a plurality of conductive bumps 211 containing a solder material 212 in a flip-chip manner to electrically connect the carrier structure 20. It should be understood that there are many ways to electrically connect the electronic element 21 to the carrier structure 20, such as wire bonding, and the present disclosure is not limited to the above.

The passive element 29 is, for example, a resistor, a capacitor, or an inductor, but is not limited to the above, and the passive element 29 is also electrically connected to the electrical contact pad 200.

The wires 24a, 24b are a plurality of bonding wires (such as gold wires or copper wires) used in a wire-bonding process, wherein the wire 24b is communicatively connected to one of the second contacts 233 and one of the electrical contact pads 201 of the carrier structure 20, and the wire 24a grounds and is connected to another one of the second contacts 233 and another one of the electrical contact pads 201 of the carrier structure 20.

In an embodiment, the wire 24a grounds the conductive via 220 via the redistribution layer 231 and the second contact 233, so that the metal layer 28 grounds the carrier structure 20.

In addition, the interposer 2a is bonded on the inactive surface 21b of the electronic element 21 with the metal layer 28 thereon by a bonding layer 280 such as an adhesive. For example, the bonding layer 280 is formed on the metal layer 28 of the interposer 2a first (as shown in FIG. 2A), and then the interposer 2a is bonded onto the electronic element 21 on the carrier structure 20. It should be understood that the bonding layer 280 may also be formed on the electronic element 21 first, and then the interposer 2a is bonded onto the bonding layer 280. Alternatively, the interposer 2a is firstly bonded on the electronic element 21 with the bonding layer 280, and then the electronic element 21 connected with the interposer 2a is bonded onto the first side 20a of the carrier structure 20.

Figure 2C:
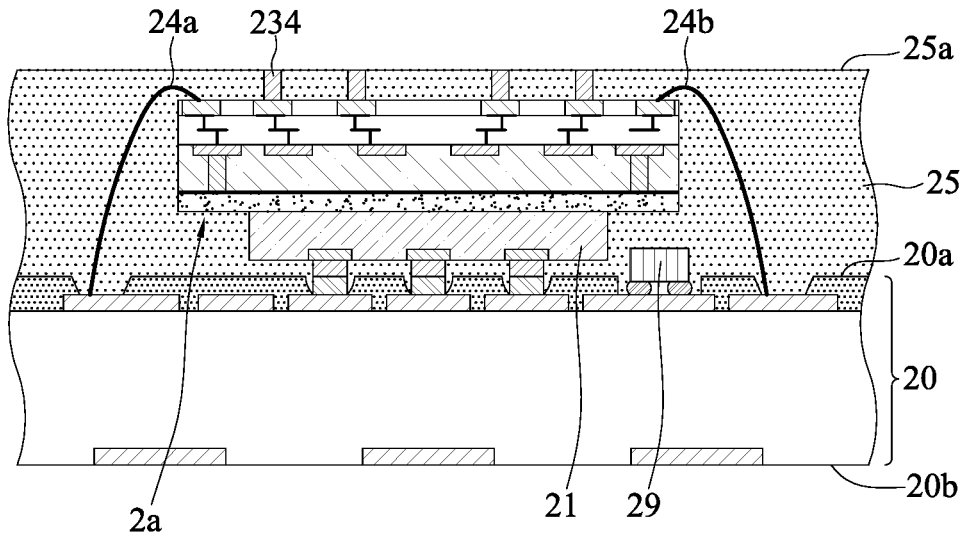

As shown in FIG. 2C, a cladding layer 25 is formed on the first side 20a of the carrier structure 20, so that the electronic element 21, the passive element 29, the wires 24a, 24b and the interposer 2a are covered by the cladding layer 25, and end surfaces of the conductors 234 of the interposer 2a are exposed from the cladding layer 25.

In an embodiment, the cladding layer 25 is made of an insulating material, such as polyimide, dry film, encapsulant such as epoxy resin, or molding compound, and the cladding layer 25 can be formed on the first side 20a of the carrier structure 20 by lamination or compression molding.

Moreover, a portion of the material of the cladding layer 25, or even a portion of the material of the conductors 234 can be removed by a leveling process such as etching or grinding, so that the end surfaces of the conductors 234 are coplanar with an upper surface of the cladding layer 25, that is, an upper surface 25a of the cladding layer 25 is flush with the end surfaces of the conductors 234. It should be understood that the manner in which the conductors 234 are exposed from the cladding layer 25 is not limited to the way of using a leveling process, for example, openings for exposing the conductors 234 may be formed on the cladding layer 25.

Also, the wires 24a, 24b are free from being exposed from the cladding layer 25; however, in other embodiments, the wires 24a, 24b can be exposed from the cladding layer 25.

Figure 2D:
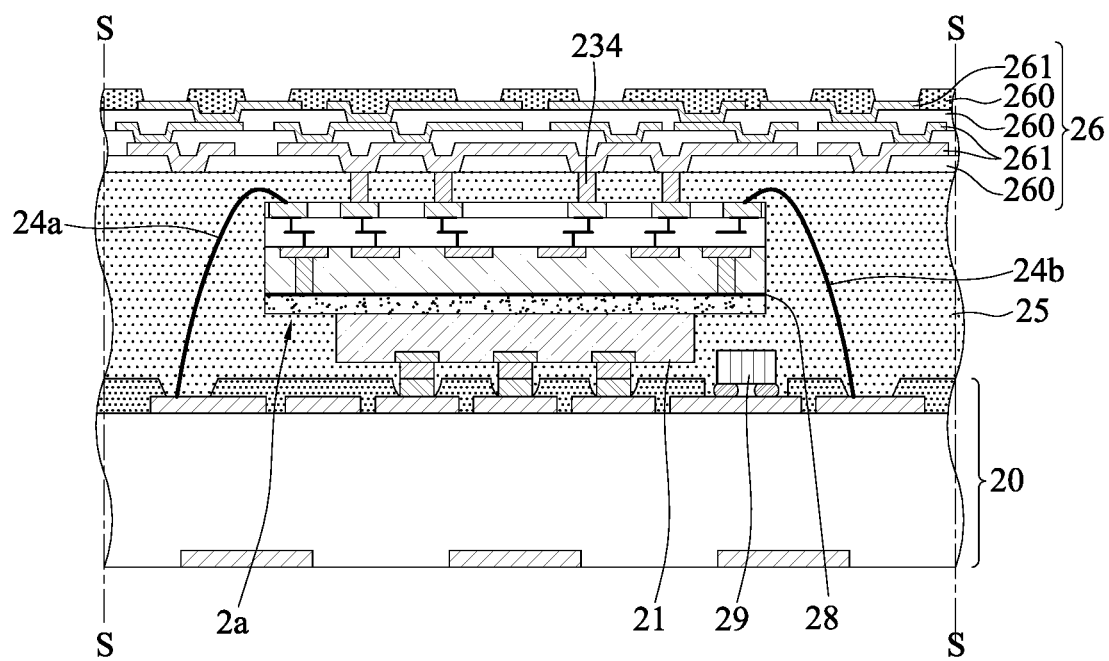

As shown in FIG. 2D, a circuit structure 26 is formed on the cladding layer 25, and the circuit structure 26 is electrically connected to the conductors 234.

In an embodiment, the circuit structure 26 includes a plurality of dielectric layers 260 and a plurality of circuit layers 261 of such as RDL specifications on the dielectric layers 260, so that the circuit layers 261 are electrically connected to the conductors 234. For example, the material for forming the circuit layers 261 is copper, and the material for forming the dielectric layers 260 is dielectric material such as polybenzoxazole (PBO), polyimide (PI), prepreg (PP).

Furthermore, the wires 24a, 24b are free from being in contact with the circuit structure 26; however, in other embodiments, the wires 24a, 24b may be in contact with the dielectric layer 260 but free from being in contact with the circuit layer 261.

Figure 2E:
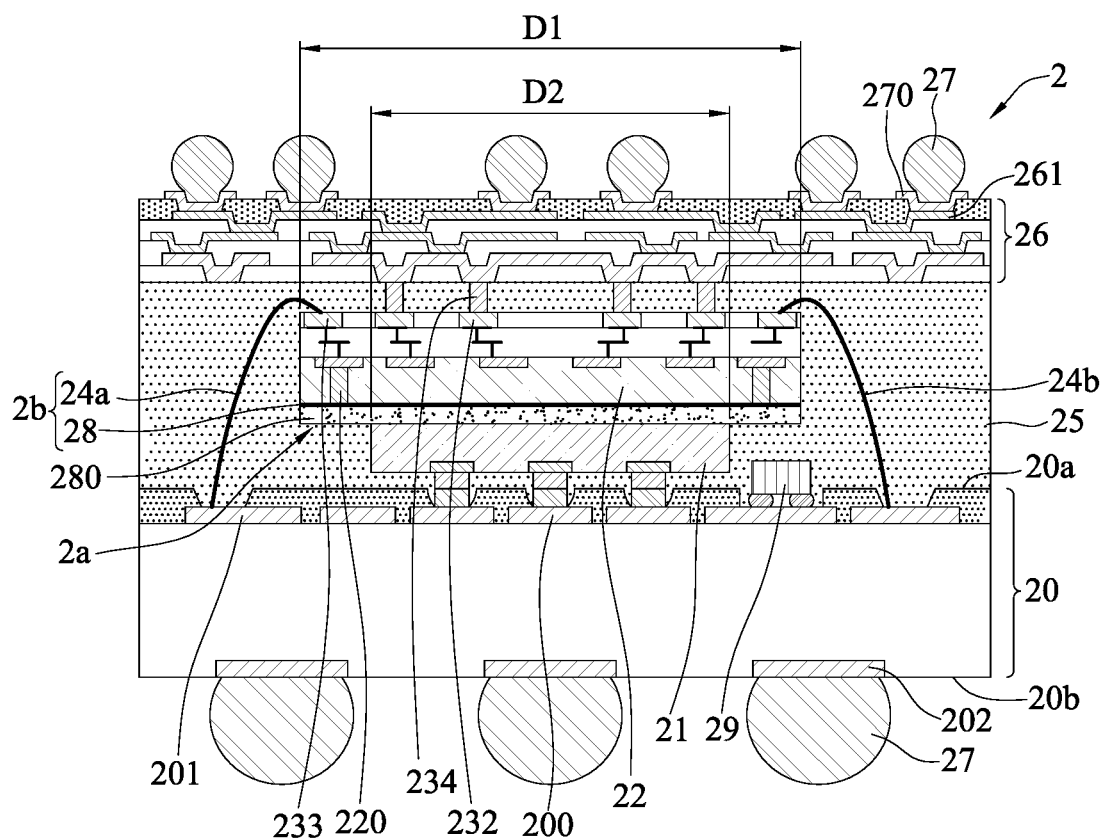

As shown in FIG. 2E, a singulation process is performed along cutting paths S shown in FIG. 2D to obtain the electronic package 2 of the present disclosure.

Figure 2F:
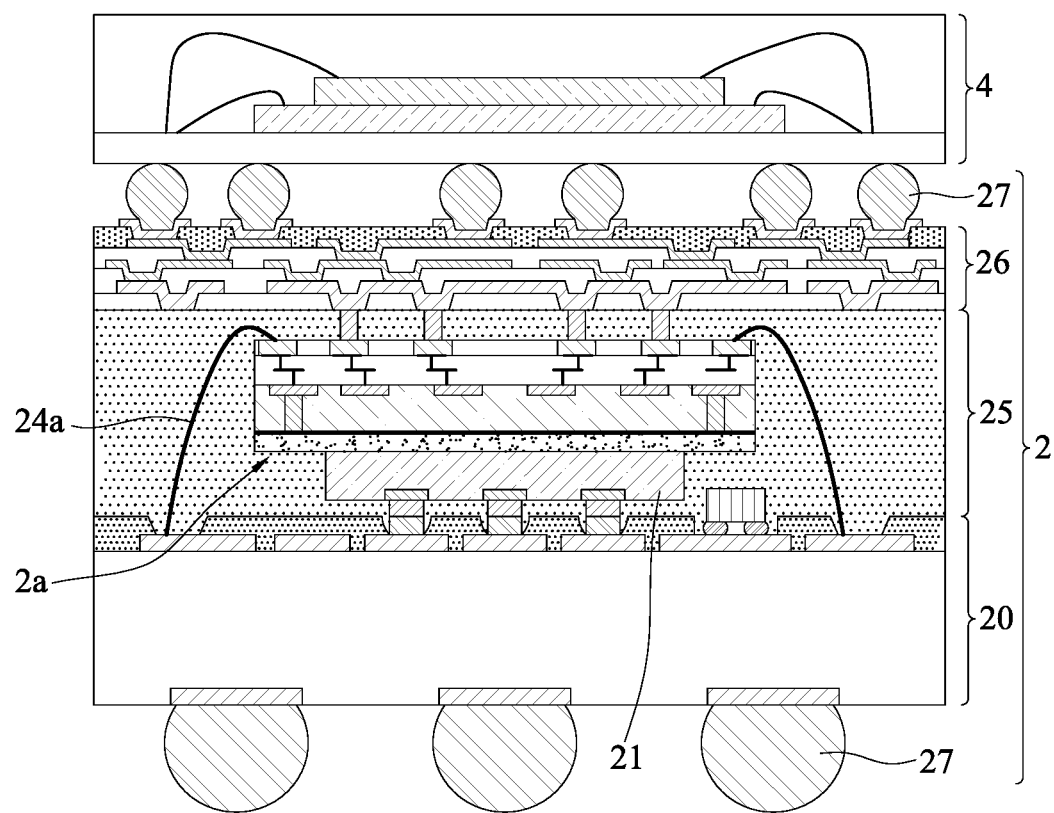
FIG. 2F is a schematic cross-sectional view showing the subsequent process of FIG. 2E.

In the subsequent process, a plurality of conductive elements 27 such as solder balls can be formed on the outermost circuit layer 261 of the circuit structure 26, so as to provide for the subsequent placement of an electronic device 4 (as shown in FIG. 2F) such as a package structure or other structures (e.g., another package or chip). In addition, an under bump metallurgy (UBM) layer 270 may be formed on the outermost circuit layer 261 of the circuit structure 26 to facilitate bonding the conductive elements 27.

Figure 3A:
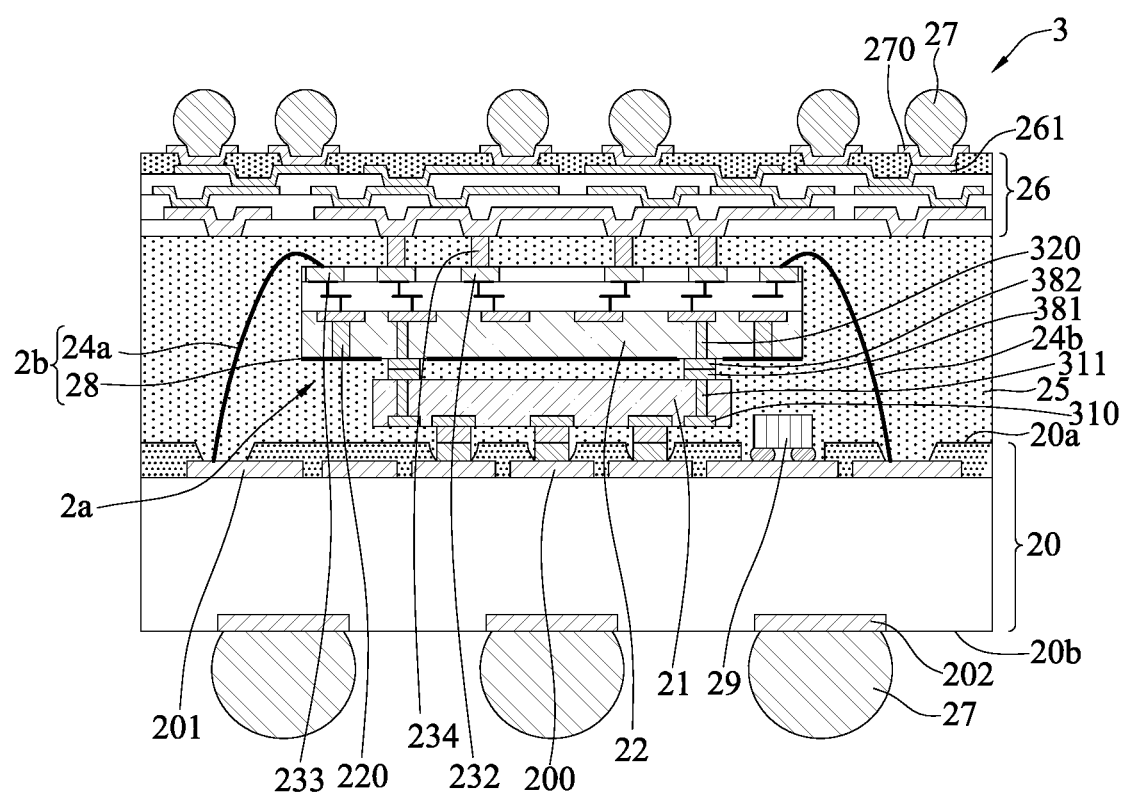
FIG. 3A and FIG. 3B are schematic cross-sectional views showing other embodiments of FIG. 2E.

Moreover, the interposer 2a can also be stacked on the inactive surface 21b of the electronic element 21 by means of a conductive material. For example, as shown in FIG. 3A, copper bumps 382 are formed on end surfaces of some of conductive vias 320 of the semiconductor substrate 22, so that the copper bumps 382 are free from being in contact with and electrically connected to the metal layer 28, and the electronic element 21 has at least one conductive hole 311 connecting the active surface 21a and the inactive surface 21b, so that the conductive holes 311 are electrically connected to some of electrode pads 310, and copper bumps 381 are also formed on the end surfaces of the conductive holes 311 on the inactive surface 21b, and then the copper bumps 382 of the interposer 2a are in contact with and abutted against the copper bumps 381 of the electronic element 21, so that the interposer 2a is electrically connected to the electronic element 21.

Figure 3B:
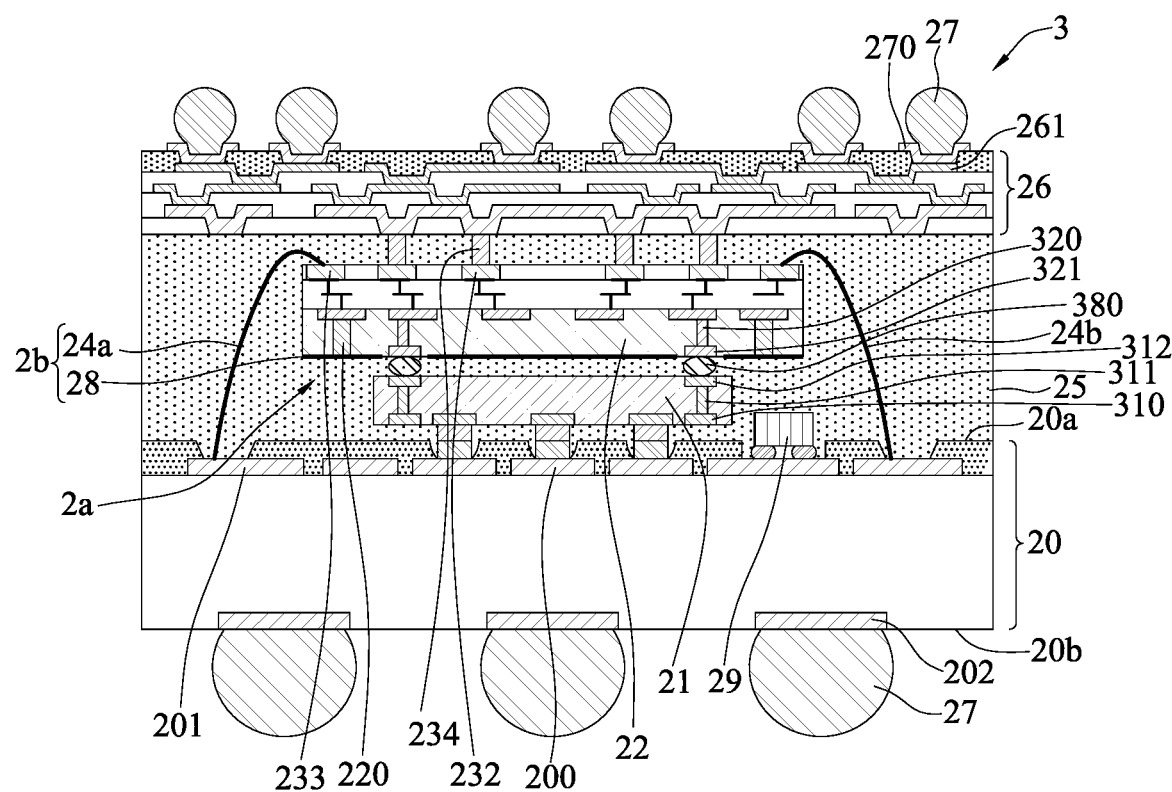

Alternatively, as shown in FIG. 3B, copper pads 321 are formed on the end surfaces of some of the conductive vias 320 of the semiconductor substrate 22, so that the copper pads 321 are free from being in contact with and electrically connected to the metal layer 28, and copper pads 312 are also formed on the end surfaces of the conductive holes 311 of the electronic element 21 on the inactive surface 21b, then the copper pads 321 of the interposer 2a is bonded to the copper pads 312 of the electronic element 21 via a solder material 380, so that the interposer 2a is electrically connected to the electronic element 21.

In addition, the plurality of conductive elements 27 such as solder balls can also be formed on the ball-placement pads 202 of the second side 20b of the carrier structure 20, so as to provide for subsequent placement of an electronic device (not shown) such as a package structure or other structures (such as a circuit board, another package, or a chip).

Therefore, the manufacturing method of the electronic package 2 of the present disclosure is to connect the interposer 2a and the carrier structure 20 by the wires 24a, 24b, so as to surround the electronic element 21, so that the wire 24a grounds the carrier structure 20. Therefore, compared with the prior art, the wire 24a, which is free from being used for communication, can be used as a shielding element when the electronic package 2 of the present disclosure is in operation, so as to prevent the electronic element 21 from being subjected to external electromagnetic interference, so that the electronic element 21 can be operated normally and the damage of the electronic element 21 can be avoided, such that the electronic package 2 can effectively maintain the normal operation of the product and improve the reliability of the product.

Moreover, the metal layer 28 and the wire 24a can form a shielding structure 2b around the electronic element 21, so that the shielding structure 2b can protect the electronic element 21 from external electromagnetic interference when the electronic package 2 is in operation, such that the electronic element 21 can be operated normally and the damage of the electronic element 21 can be avoided.

Also, a width D1 of the interposer 2a can be greater than a width D2 of the electronic element 21, so as to facilitate the wiring operation of the wires 24a, 24b.

In addition, the interposer 2a can also transmit signals between the carrier structure 20 and the circuit structure 26 via the conductors 234 and the wire 24b (the wire 24b is used for communication), so as to increase the functional requirements of the electronic package 2.

The present disclosure further provides an electronic package 2, which comprises: a carrier structure 20 having a routing layer, at least one electronic element 21, at least one interposer 2a and at least one wire 24a, 24b.

The carrier structure 20 has a first side 20a and a second side 20b opposing the first side 20a, and the routing layer on the first side 20a has a plurality of electrical contact pads 200, 201.

The electronic element 21 is disposed on the carrier structure 20 and electrically connected to some of the electrical contact pads 200 of the routing layer.

The interposer 2a is stacked on the electronic element 21 and includes a semiconductor substrate 22. The semiconductor substrate 22 has a first surface 22a and a second surface 22b opposing the first surface 22a, so that the semiconductor substrate 22 is bonded onto the electronic element 21 with the second surface 22b, wherein a plurality of first contacts 232 and at least one second contact 233 are disposed on the first surface 22a of the semiconductor substrate 22, and a plurality of conductors 234 are formed on the plurality of first contacts 232.

The wires 24a, 24b are connected to the second contacts 233 and some of the electrical contact pads 201 of the carrier structure 20, and the wire 24a grounds one of the electrical contact pads 201 of the carrier structure 20.

In one embodiment, the interposer 2a further includes a routing structure 23 bonded onto the first surface 22a of the semiconductor substrate 22, so that the plurality of first contacts 232 and the second contacts 233 are arranged on the routing structure 23.

In one embodiment, the interposer 2a further includes a metal layer 28 bonded to the electronic element 21. For example, the metal layer 28 is located on the second surface 22b of the semiconductor substrate 22 of the interposer 2a.

In one embodiment, the semiconductor substrate 22 has at least one conductive via 220 connecting the first surface 22a and the second surface 22b, so that the conductive via 220 grounds the wire 24a via the second contact 233.

In one embodiment, the at least one second contact 233 is a plurality of second contacts 233, and the at least one wire 24a, 24b is a plurality of wires 24a, 24b, so that at least one of the plurality of wires 24b is communicatively connected to at least one of the plurality of second contacts 233 and the carrier structure 20, and at least one of the plurality of wires 24a is grounded and connected to at least another one of the plurality of second contacts 233 and the carrier structure 20.

In one embodiment, a width D1 of the interposer 2a is greater than a width D2 of the electronic element 21.

In one embodiment, the electronic package 2 further includes a cladding layer 25 formed on the first side 20a of the carrier structure 20, so that the electronic element 21, the interposer 2a and the wires 24a, 24b are covered by the cladding layer 25. For example, the end surfaces of the conductors 234 are coplanar with the upper surface of the cladding layer 25. Further, the electronic package 2 further includes a circuit structure 26 formed on the cladding layer 25 to electrically connect the conductors 234 of the interposer 2a.

To sum up, the electronic package of the present disclosure and the manufacturing method thereof are to surround the electronic element by connecting the interposer and grounding the carrier structure via the wire. Therefore, the wire can be used as a shielding element when the electronic package of the present disclosure is in operation so as to prevent the electronic element from being subjected to external electromagnetic interference, so that the electronic element can be performed normally and the damage of the electronic element can be avoided, such that the electronic package can effectively maintain the normal operation of the product to improve the reliability of the product.

The foregoing embodiments are provided for the purpose of illustrating the principles and effects of the present disclosure, rather than limiting the present disclosure. Anyone skilled in the art can modify and alter the above embodiments without departing from the spirit and scope of the present disclosure. Therefore, the scope of protection with regard to the present disclosure should be as defined in the accompanying claims listed below.

What is claimed is:

1. An electronic package, comprising:
    a carrier structure having a routing layer;
    an electronic element disposed on the carrier structure and electrically connected to the routing layer;
    an interposer stacked on the electronic element and including a semiconductor substrate, wherein the semiconductor substrate has a first surface and a second surface opposing the first surface, and the semiconductor substrate is bonded onto the electronic element with the second surface, wherein the first surface of the semiconductor substrate is arranged with a plurality of first contacts and at least one second contact, and a plurality of conductors are formed on the plurality of first contacts, wherein the interposer further includes a metal layer bonded to the electronic element, and the metal layer is located on the second surface of the semiconductor substrate of the interposer; and
    at least one wire connected to the at least one second contact and the carrier structure and grounding the carrier structure.

2. The electronic package of claim 1, wherein the interposer further includes a routing structure bonded onto the first surface of the semiconductor substrate, and the plurality of first contacts and the at least one second contact are disposed on the routing structure.

3. The electronic package of claim 1, wherein the semiconductor substrate has at least one conductive via connecting the first surface and the second surface, and the conductive via grounds the wire via the at least one second contact.

4. The electronic package of claim 1, wherein the at least one second contact is a plurality of second contacts, and the at least one wire is a plurality of wires, wherein at least one of the plurality of wires is communicatively connected to at least one of the plurality of second contacts and the carrier structure, and at least another one of the plurality of wires is grounded and connected to at least another one of the plurality of second contacts and the carrier structure.

5. The electronic package of claim 1, wherein the interposer has a width greater than a width of the electronic element.

6. The electronic package of claim 1, further comprising a cladding layer formed on the carrier structure, wherein the electronic element, the interposer and the wire are covered by the cladding layer.

7. The electronic package of claim 6, wherein end surfaces of the plurality of conductors are coplanar with an upper surface of the cladding layer.

8. The electronic package of claim 6, further comprising a circuit structure formed on the cladding layer and electrically connected to the plurality of conductors of the interposer.

9. A method of manufacturing an electronic package, comprising:
providing a carrier structure with a routing layer, an electronic element and an interposer including a semiconductor substrate, wherein the semiconductor substrate has a first surface and a second surface opposing the first surface, and a plurality of first contacts and at least one second contact are arranged on the first surface of the semiconductor substrate, and a plurality of conductors are formed on the plurality of first contacts;
disposing the electronic element and the interposer on the carrier structure, the interposer being stacked on the electronic element, wherein the electronic element is electrically connected to the routing layer, and the semiconductor substrate is bonded onto the electronic element with the second surface, wherein the interposer further includes a metal layer bonded to the electronic element, and the metal layer is located on the second surface of the semiconductor substrate of the interposer; and
connecting at least one wire to the at least one second contact and the carrier structure, wherein the at least one wire grounds the carrier structure.

10. The method of claim 9, wherein the interposer further includes a routing structure bonded onto the first surface of the semiconductor substrate, and the plurality of first contacts and the at least one second contact are disposed on the routing structure.

11. The method of claim 9, wherein the semiconductor substrate has at least one conductive via connecting the first surface and the second surface, and the conductive via grounds the wire via the at least one second contact.

12. The method of claim 9, wherein the at least one second contact is a plurality of second contacts, and the at least one wire is a plurality of wires, wherein at least one of the plurality of wires is communicatively connected to at least one of the plurality of second contacts and the carrier structure, and at least another one of the plurality of wires is grounded and connected to at least another one of the plurality of second contacts and the carrier structure.

13. The method of claim 9, wherein the interposer has a width greater than a width of the electronic element.

14. The method of claim 9, further comprising forming a cladding layer on the carrier structure, wherein the electronic element, the interposer and the wire are covered by the cladding layer.

15. The method of claim 14, wherein end surfaces of the plurality of conductors are coplanar with an upper surface of the cladding layer.

16. The method of claim 14, further comprising forming a circuit structure on the cladding layer, wherein the circuit structure is electrically connected to the plurality of conductors of the interposer.

* * * * *